United States Patent
Ito et al.

(10) Patent No.: US 11,784,253 B2
(45) Date of Patent: Oct. 10, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kazuyuki Ito, Kamakura (JP); Takuo Kikuchi, Kamakura (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 155 days.

(21) Appl. No.: 17/525,254

(22) Filed: Nov. 12, 2021

(65) Prior Publication Data

US 2022/0285553 A1 Sep. 8, 2022

(30) Foreign Application Priority Data

Mar. 4, 2021 (JP) ................................ 2021-034170

(51) Int. Cl.
*H01L 29/78* (2006.01)
*H01L 29/417* (2006.01)

(52) U.S. Cl.
CPC .... *H01L 29/7848* (2013.01); *H01L 29/41775* (2013.01); *H01L 29/7811* (2013.01)

(58) Field of Classification Search
CPC ........... H01L 29/7848; H01L 29/41775; H01L 29/7811; H01L 29/41766; H01L 29/0696; H01L 29/407; H01L 29/4238; H01L 29/7843; H01L 29/7813
See application file for complete search history.

(56) References Cited

U.S. PATENT DOCUMENTS

2014/0197479 A1* 7/2014 Um ..................... H01L 29/7803
438/270

FOREIGN PATENT DOCUMENTS

| JP | 2013-187482 A | 9/2013 |
|---|---|---|
| JP | 6109018 B2 | 4/2017 |

* cited by examiner

*Primary Examiner* — Mohammed R Alam
(74) *Attorney, Agent, or Firm* — Oblon, McClelland, Maier & Neustadt, L.L.P.

(57) ABSTRACT

A semiconductor device according to an embodiment includes first and second electrodes, a gate electrode, first to third semiconductor regions, and first and second insulating parts. The first semiconductor region is located on the first electrode. The second semiconductor region is located on the first semiconductor region. The third semiconductor region is located on the second semiconductor region. The first insulating part is arranged with the third semiconductor region, the second semiconductor region, and a portion of the first semiconductor region. The gate electrode is located in the first insulating part. The gate electrode faces the second semiconductor region. The second insulating part is located on the third semiconductor region. The second insulating part is not overlapping the gate electrode. The second insulating part has tensile stress. The second electrode is located on the second insulating part and electrically connected with the third semiconductor region.

5 Claims, 8 Drawing Sheets

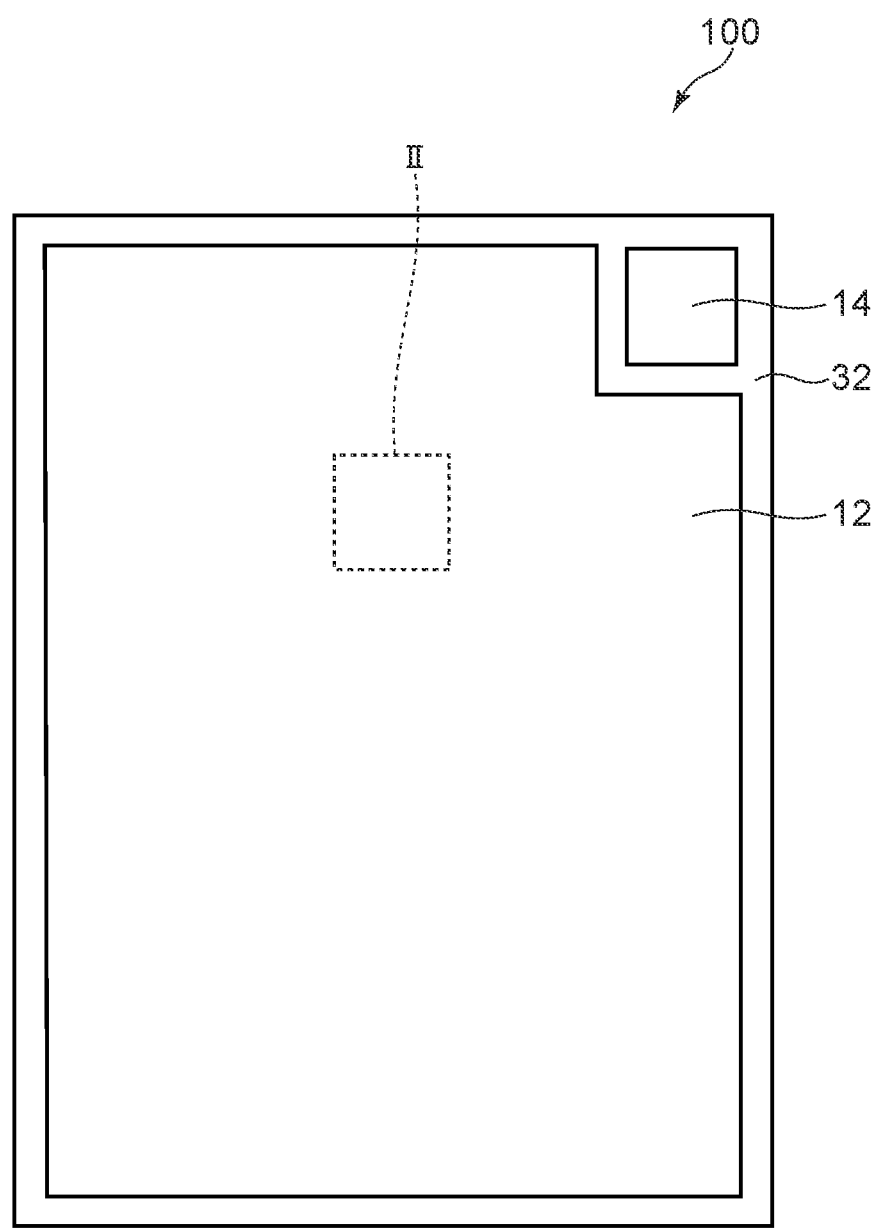
FIG. 1
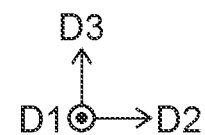

SEMICONDUCTOR DEVICE

CROSS-REFERENCE TO RELATED APPLICATIONS

This application is based upon and claims the benefit of priority from Japanese Patent Application No. 2021-034170, filed on Mar. 4, 2021; the entire contents of which are incorporated herein by reference.

FIELD

Embodiments described herein relate generally to a semiconductor device.

BACKGROUND

A semiconductor device such as a vertical metal oxide semiconductor field effect transistor (MOSFET) or the like is used in applications such as power conversion, etc. It is desirable to reduce the on-resistance of the semiconductor device.

BRIEF DESCRIPTION OF THE DRAWINGS

FIG. 1 is a plan view illustrating a semiconductor device according to a first embodiment;

DETAILED DESCRIPTION

Figure 2:
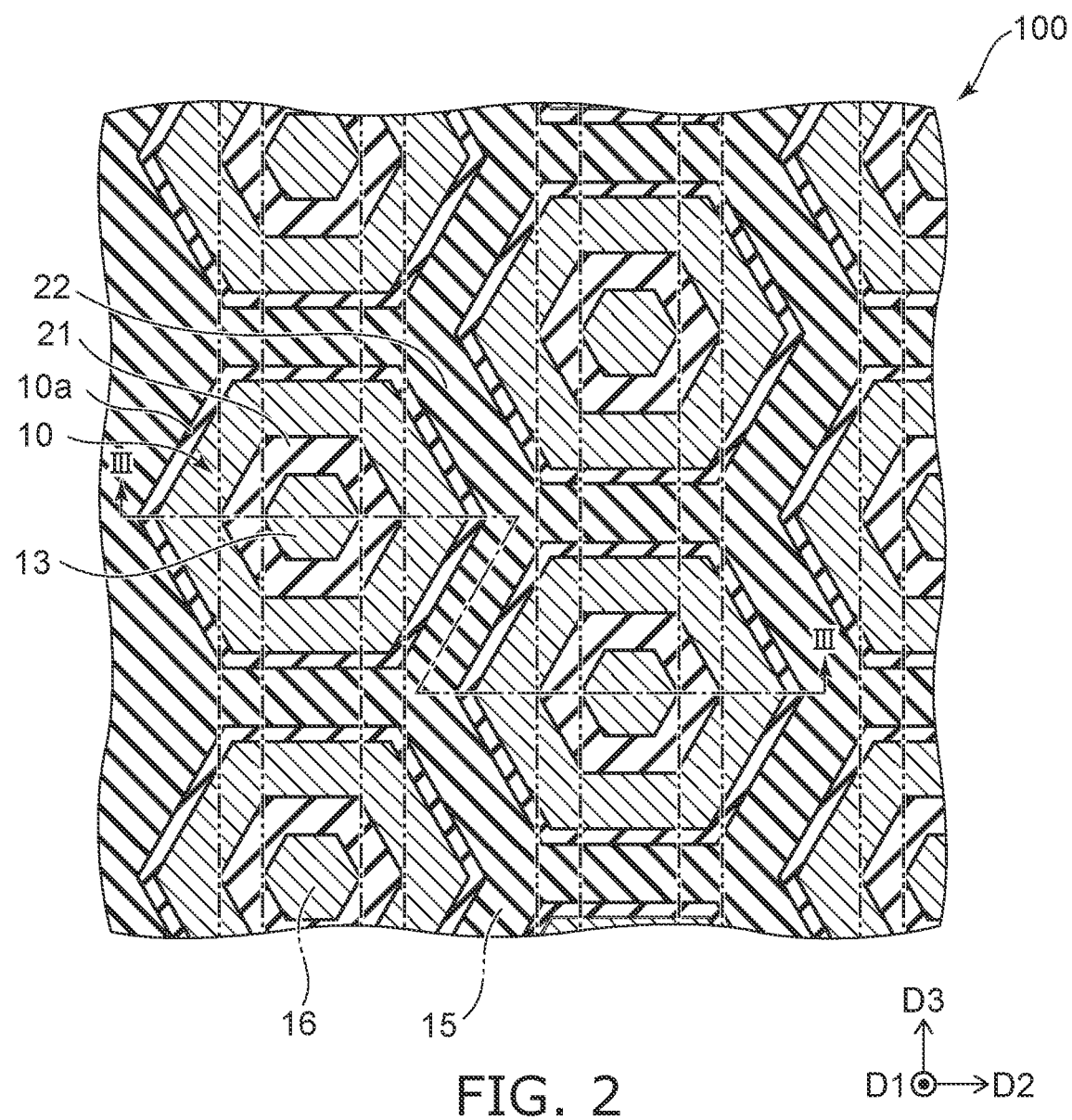
FIG. 2 is a plan view illustrating portion II of FIG. 1.

A semiconductor device according to an embodiment includes a first electrode, a first semiconductor region of a first conductivity type, a second semiconductor region of a second conductivity type, a third semiconductor region of the first conductivity type, a first insulating part, a gate electrode, a second insulating part, and a second electrode. The first semiconductor region is located on the first electrode. The second semiconductor region is located on the first semiconductor region. The third semiconductor region is located selectively on the second semiconductor region. The first insulating part is arranged with the third semiconductor region, the second semiconductor region, and a portion of the first semiconductor region in a second direction perpendicular to a first direction that is from the first electrode toward the first semiconductor region. The gate electrode is located in the first insulating part and faces the second semiconductor region in the second direction. The second insulating part is located on the third semiconductor region but does not overlap the gate electrode in the first direction. The second insulating part has tensile stress in the first direction. The second electrode is located on the second insulating part and is electrically connected with the third semiconductor region.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals; and a detailed description is omitted as appropriate.

In the following description and drawings, the notations of $n^+$, $n^-$, $p^+$, and p indicate relative levels of the impurity concentrations. Namely, a notation marked with "+" indicates that the impurity concentration is relatively greater than that of a notation not marked with either "+" or "−"; and a notation marked with "−" indicates that the impurity concentration is relatively less than a notation without any mark. When both an impurity that forms acceptors and an impurity that forms donors are included in each region, these notations indicate relative levels of the net impurity concentrations after the impurities are compensated.

In the embodiments described below, each embodiment may be implemented by inverting the p-type and the n-type of the semiconductor regions.

First Embodiment

FIG. 1 is a plan view illustrating a semiconductor device according to a first embodiment.

FIG. 2 is a plan view illustrating portion II of FIG. 1.

Figure 3:
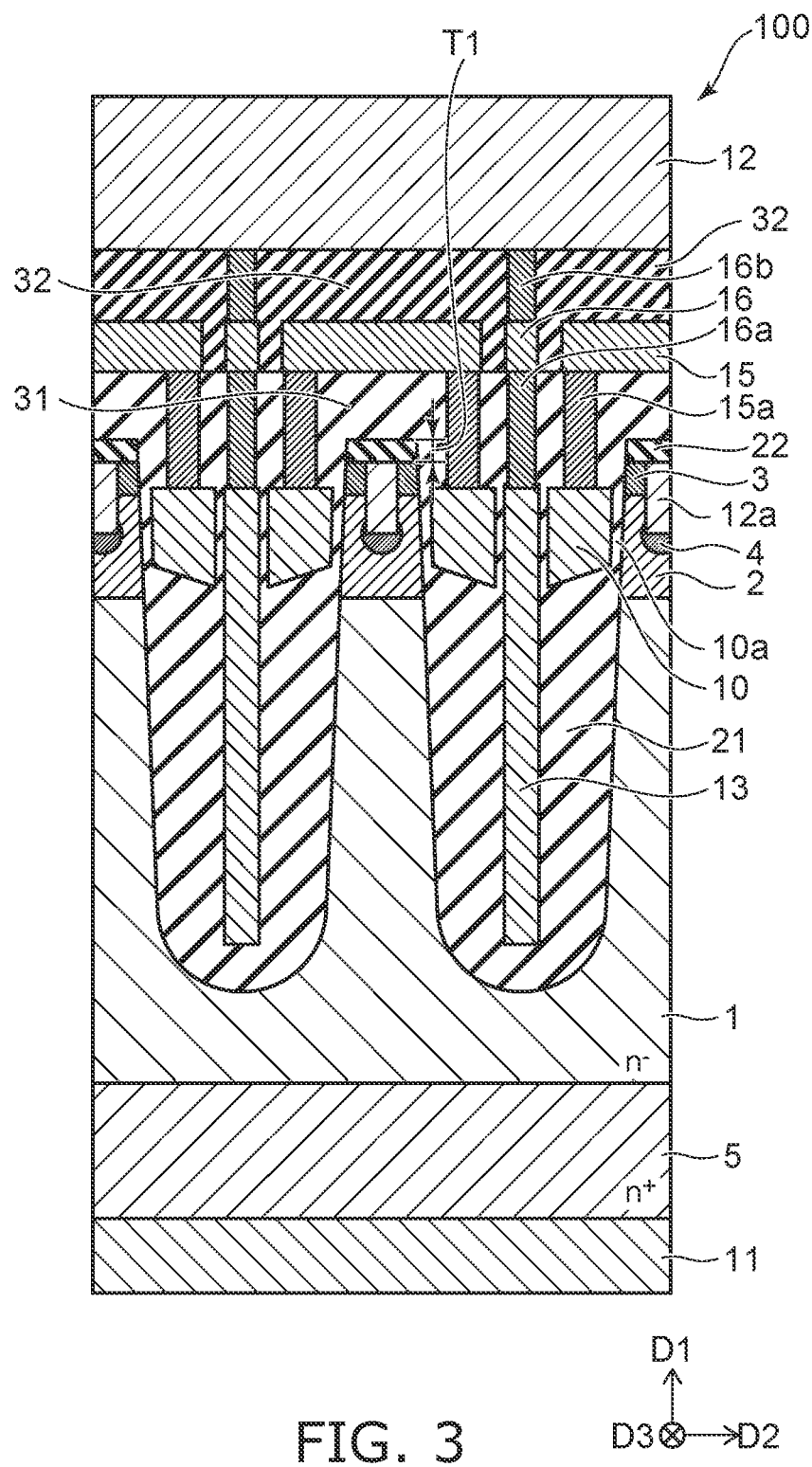
FIG. 3 is a III-III cross-sectional view of FIG. 2.

FIG. 3 is a III-III cross-sectional view of FIG. 2.

The semiconductor device 100 according to the first embodiment is, for example, a vertical MOSFET. The semiconductor device 100 is a MOSFET that has a so-called dot structure.

As illustrated in FIGS. 1 to 3, the semiconductor device 100 includes an $n^-$-type (first-conductivity-type) drift region 1 (a first semiconductor region), a p-type (second-conductivity-type) base region 2 (a second semiconductor region), an $n^+$-type source region 3 (a third semiconductor region), a $p^+$-type contact region 4, an $n^+$-type drain region 5, a gate electrode 10, a drain electrode 11 (a first electrode), a source electrode 12 (a second electrode), a FP electrode 13 (a third electrode), a gate pad 14, a gate wiring layer 15, a FP wiring layer 16, a first insulating part 21, a second insulating part 22, an insulating layer 31, and an insulating layer 32. "FP" means "field plate".

A first direction D1, a second direction D2, and a third direction D3 are used in the description of the following embodiments. The direction from the drain electrode 11 toward the $n^-$-type drift region 1 is taken as the first direction D1. One direction perpendicular to the first direction D1 is taken as the second direction D2. A direction that crosses the second direction D2 and is perpendicular to the first direction D1 is taken as the third direction D3. In the description, the direction from the drain electrode 11 toward the $n^-$-type drift region 1 is called "up", and the opposite direction is called "down". These directions are based on the relative positional relationship between the drain electrode 11 and the $n^-$-type drift region 1 and are independent of the direction of gravity.

As illustrated in FIG. 1, the source electrode 12 and the gate pad 14 are located at the upper surface of the semiconductor device 100. The source electrode 12 and the gate pad 14 are electrically isolated from each other.

As illustrated in FIG. 3, the drain electrode 11 is located at the lower surface of the semiconductor device 100. The n⁻-type drift region 1 is located on the drain electrode 11 with the n⁺-type drain region 5 interposed. The n⁻-type drift region 1 is electrically connected with the drain electrode 11 via the n⁺-type drain region 5. The p-type base region 2 is located on the n⁻-type drift region 1. The n⁺-type source region 3 and the p⁺-type contact region 4 are selectively located on the p-type base region 2.

The first insulating part 21 is arranged with the n⁺-type source region 3, the p-type base region 2, and a portion of the n⁻-type drift region 1 in the second direction D2. The gate electrode 10 and the FP electrode 13 are located in the first insulating part 21. The gate electrode 10 faces the p-type base region 2 via a gate insulating layer 10a that is a portion of the first insulating part 21 in the second direction D2. The FP electrode 13 faces the gate electrode 10 in the second direction D2. In the example, the FP electrode 13 faces the n⁻-type drift region 1 in the second direction D2. The gate electrode 10 is positioned between the FP electrode 13 and the p-type base region 2 in the second direction D2. A portion of the first insulating part 21 is located between the gate electrode 10 and the FP electrode 13. Thereby, the gate electrode 10 and the FP electrode 13 are electrically isolated from each other.

The second insulating part 22 is located on the n⁺-type source region 3. The second insulating part 22 is located, with the n⁺-type source region 3 interposed, on the p-type base region 2 in which a channel is formed. For example, the second insulating part 22 contacts the n⁺-type source region 3 in the first direction D1. The second insulating part 22 does not overlap the gate electrode 10 in the first direction D1. The second insulating part 22 does not overlap the FP electrode 13 in the first direction D1. The second insulating part 22 is arranged with a portion of the first insulating part 21 in the second direction D2.

The second insulating part 22 has tensile stress in the first direction D1. The tensile stress in the first direction D1 of the second insulating part 22 is, for example, not less than 100 MPa and not more than 500 MPa. A thickness T1 of the first direction D1 of the second insulating part 22 is, for example, not less than 100 nm and not more than 500 nm.

The source electrode 12 is located on the second insulating part 22, the gate electrode 10, and the FP electrode 13. The source electrode 12 includes a connection part 12a located between the n⁺-type source regions 3 in the second direction D2. In the example, a portion of the second insulating part 22 is located on the connection part 12a. The connection part 12a extends upward and is electrically connected with the source electrode 12 at some position where the second insulating part 22 is not provided. Thereby, the p-type base region 2 and the n⁺-type source region 3 are connected with the source electrode 12 via the connection part 12a.

The p⁺-type contact region 4 is located between the p-type base region 2 and the connection part 12a. The p-type base region 2 is electrically connected with the source electrode 12 via the p⁺-type contact region 4 and the connection part 12a. In the semiconductor device 100, the p⁺-type contact region 4 is positioned lower than the n⁺-type source region 3.

The gate wiring layer 15 is located between the gate electrode 10 and the source electrode 12 in the first direction D1. A portion of the gate wiring layer 15 is positioned between the second insulating part 22 and the source electrode 12 in the first direction D1. The gate wiring layer 15 is electrically connected with the gate electrode 10 via a connection part 15a located between the gate wiring layer 15 and the gate electrode 10. The gate wiring layer 15 is electrically connected with the gate pad 14 via a not-illustrated connection part.

The FP wiring layer 16 is located between the FP electrode 13 and the source electrode 12 in the first direction D1. The FP wiring layer 16 is arranged with the gate wiring layer 15 in the second direction D2. The FP wiring layer 16 is electrically connected with the FP electrode 13 via a connection part 16a located between the FP wiring layer 16 and the FP electrode 13. The FP wiring layer 16 is electrically connected with the source electrode 12 via a connection part 16b located between the FP wiring layer 16 and the source electrode 12. That is, the FP electrode 13 is electrically connected with the source electrode 12 via the connection part 16a, the FP wiring layer 16, and the connection part 16b.

The insulating layer 31 is located between the gate electrode 10 and the gate wiring layer 15 and between the second insulating part 22 and the gate wiring layer 15 in the first direction D1. A portion of the insulating layer 31 may be located between the FP electrode 13 and the FP wiring layer 16 in the first direction D1. A portion of the insulating layer 31 is positioned between the connection part 15a and the connection part 16a in the second direction D2.

The insulating layer 32 is located between the gate wiring layer 15 and the source electrode 12 in the first direction D1. A portion of the insulating layer 32 may be located between the FP wiring layer 16 and the source electrode 12 in the first direction D1. A portion of the insulating layer 31 is positioned between the gate wiring layer 15 and the FP wiring layer 16 in the second direction D2.

As illustrated in FIG. 2, pluralities of the gate electrode 10, the FP electrode 13, and the first insulating part 21 are arranged in the second and third directions D2 and D3. The gate electrode 10 surrounds the FP electrode 13 in the second and third directions D2 and D3. That is, the FP electrode 13 is positioned inward of the gate electrode 10. The p-type base region 2, the n⁺-type source region 3, and the p⁺-type contact region 4 are located around the first insulating parts 21 in the second and third directions D2 and D3. The second insulating part 22 is located on the n⁺-type source region 3 along the n⁺-type source region 3. In FIG. 2, the source electrode 12, the connection part 15a, the connection part 16a, the connection part 16b, the insulating layer 31, and the insulating layer 32 are not illustrated, and the gate wiring layer 15 and the FP wiring layer 16 are illustrated by double dot-dash lines.

In the example, the gate electrode 10 and the FP electrode 13 are hexagonal when viewed along the first direction D1. The shapes of the gate electrode 10 and the FP electrode 13 when viewed along the first direction D1 are not limited thereto, and may be, for example, circular or polygonal such as rectangular, etc. For example, when viewed along the first direction D1, the first insulating part 21 is hexagonal, is located between the FP electrode 13 and the gate electrode 10, and is located at the periphery of the gate electrode 10. Multiple first insulating parts 21 are arranged along directions in which the line segments of the outer edges of the first insulating parts 21 extend. For example, the multiple first insulating parts 21 are arranged along the third direction D3 and are arranged also along a direction tilted 30 degrees with respect to the second direction D2. When viewed along the first direction D1, the p-type base region 2 and the second insulating part 22 have honeycomb shapes that link between the adjacent first insulating parts 21. For example, the gate wiring layer 15 and the FP wiring layer 16 have band shapes that extend in the third direction D3. The gate wiring layer 15 links the regions directly above the multiple gate electrodes 10 but is not provided in the regions directly above the FP electrodes 13. The FP wiring layer 16 links the regions directly above the multiple FP electrodes 13.

Operations of the semiconductor device 100 will now be described.

A voltage that is not less than a threshold is applied to the gate electrode 10 in a state in which a positive voltage with respect to the source electrode 12 is applied to the drain electrode 11. Thereby, a channel (an inversion layer) is formed in the p-type base region 2; and the semiconductor device 100 is set to the on-state. Electrons pass through the channel and flow from the source electrode 12 toward the drain electrode 11. Subsequently, when the voltage that is applied to the gate electrode 10 drops below the threshold, the channel in the p-type base region 2 disappears, and the semiconductor device 100 is set to the off-state.

When the semiconductor device 100 switches to the off-state, the positive voltage with respect to the source electrode 12 that is applied to the drain electrode 11 increases. In other words, the potential difference between the $n^-$-type drift region 1 and the FP electrode 13 increases. Due to the increase of the potential difference, a depletion layer spreads from the interface between the first insulating part 21 and the $n^-$-type drift region 1 toward the $n^-$-type drift region 1. The breakdown voltage of the semiconductor device 100 can be increased by the spreading of the depletion layer. Or, the on-resistance of the semiconductor device 100 can be reduced by increasing the concentration of the impurity that forms donors in the $n^-$-type drift region 1 while maintaining the breakdown voltage of the semiconductor device 100.

The second insulating part 22 tries to expand along a plane including the second and third directions D2 and D3 if the second insulating part 22 is not constrained from the outside. The second insulating part 22 tries to contract along the first direction D1 to maintain a constant volume. Tensile stress along the first direction D1 is applied by the second insulating part 22 to the p-type base region 2 (the channel). Thereby, tensile strain is generated in the channel; and the on-resistance is reduced.

Examples of the materials of the components of the semiconductor device 100 will now be described.

The $n^-$-type drift region 1, the p-type base region 2, the $n^+$-type source region 3, the $p^+$-type contact region 4, and the $n^+$-type drain region 5 include silicon, silicon carbide, gallium nitride, or gallium arsenide as a semiconductor material. When silicon is used as the semiconductor material, arsenic, phosphorus, or antimony can be used as the impurity that forms donors. Boron can be used as the impurity that forms acceptors.

The gate electrode 10 and the FP electrode 13 include a conductive material such as polysilicon, etc. An impurity may be added to the conductive material.

The first insulating part 21 and the second insulating part 22 include an insulating material. The first insulating part 21 includes, for example, silicon oxide. The second insulating part 22 includes, for example, at least one of silicon nitride or alumina.

The drain electrode 11, the source electrode 12, and the gate pad 14 include a metal such as aluminum, copper, etc.

Second Embodiment

Figure 4:
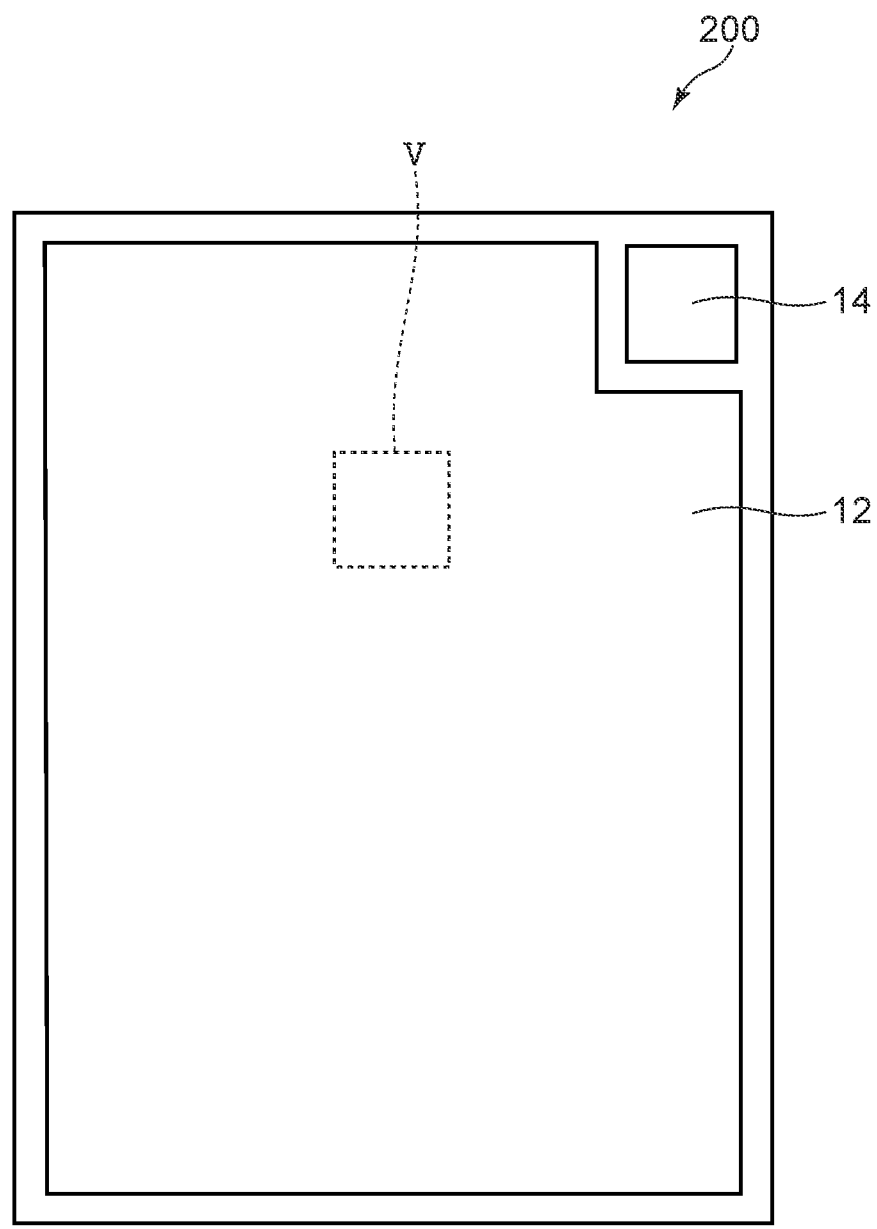
FIG. 4 is a plan view illustrating a semiconductor device according to a second embodiment.

FIG. 4 is a plan view illustrating a semiconductor device according to a second embodiment.

Figure 5:
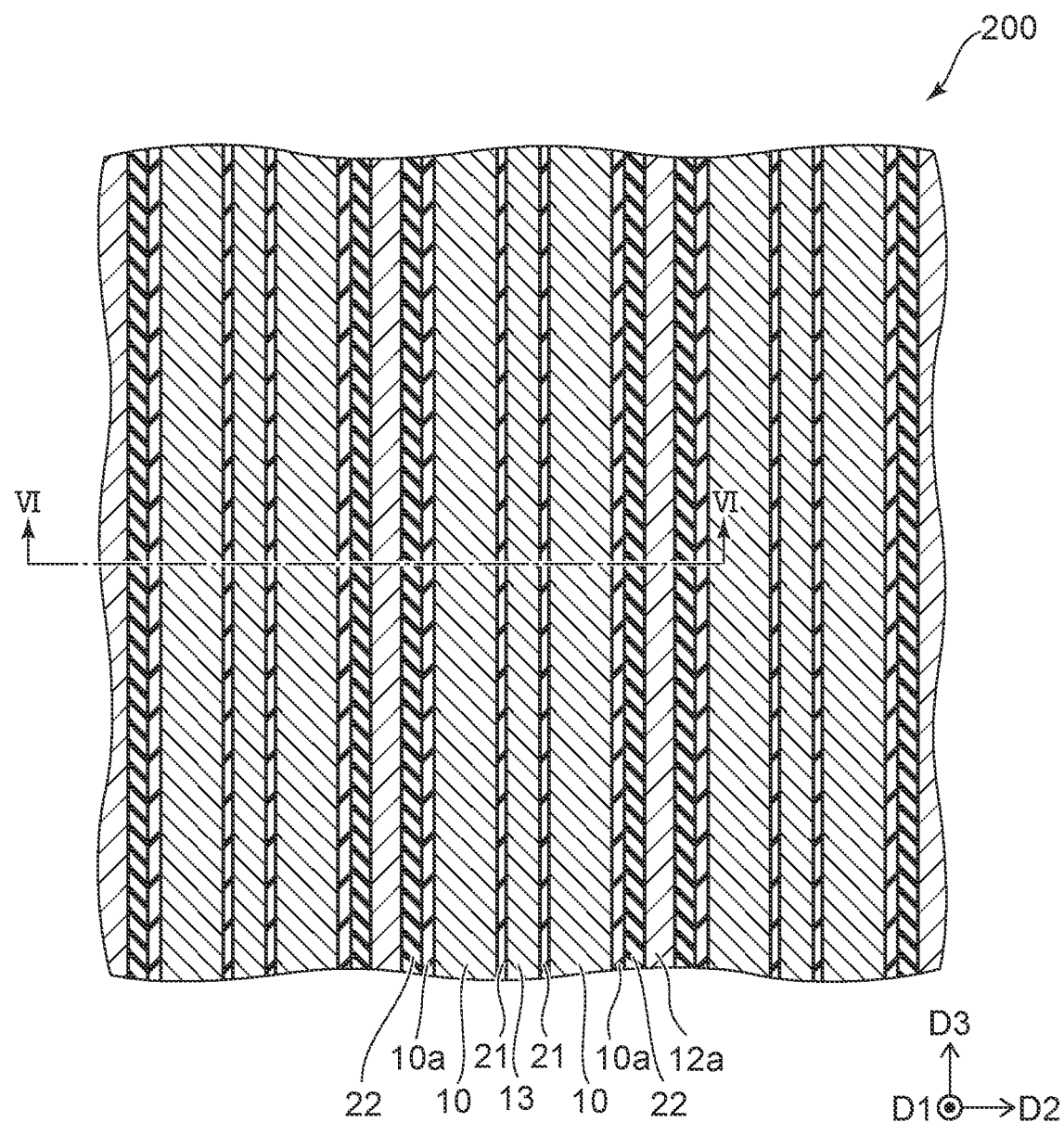
FIG. 5 is a plan view illustrating portion V of FIG. 4.

FIG. 5 is a plan view illustrating portion V of FIG. 4.

Figure 6:
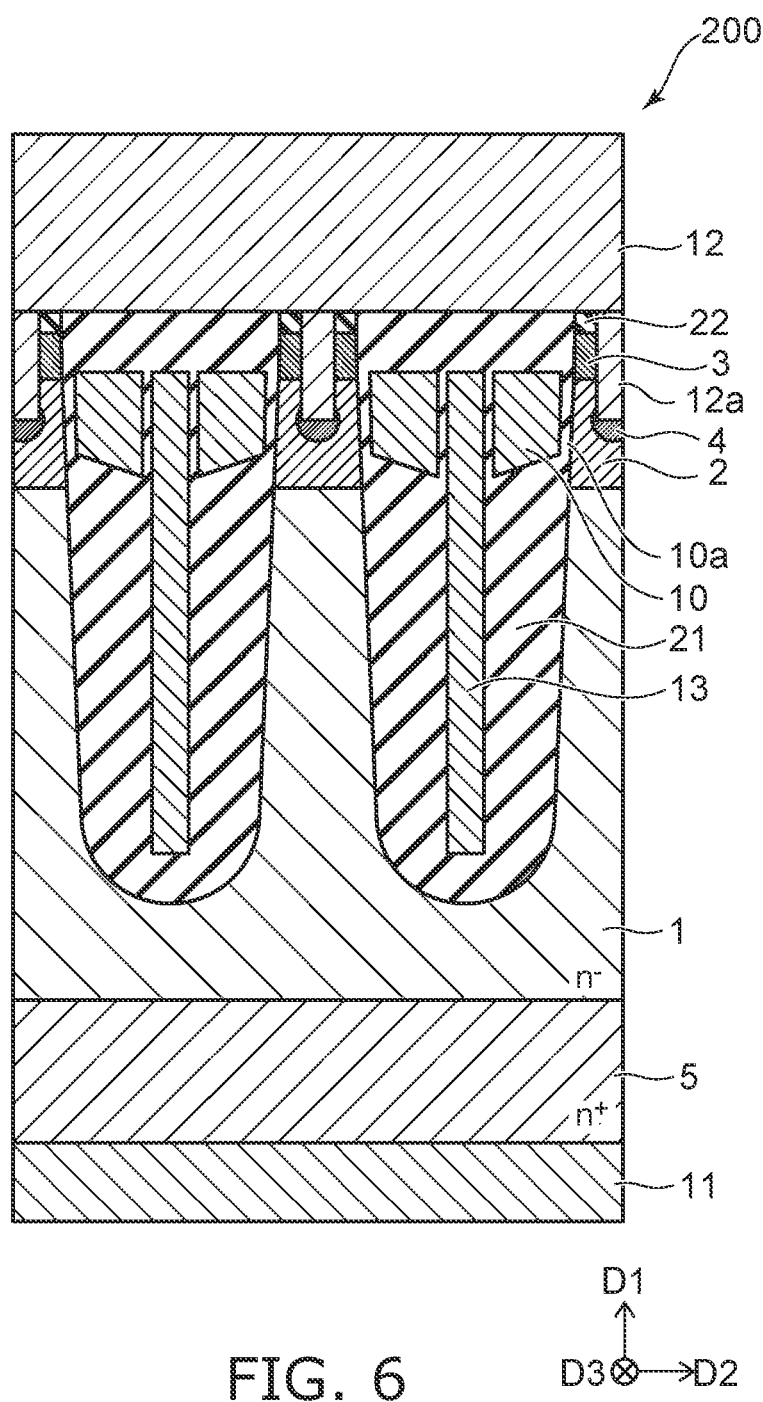
FIG. 6 is a VI-VI cross-sectional view of FIG. 5.

FIG. 6 is a VI-VI cross-sectional view of FIG. 5.

The semiconductor device 200 according to the second embodiment is, for example, a vertical MOSFET. The semiconductor device 200 is a MOSFET that has a so-called stripe structure.

As illustrated in FIGS. 4 to 6, the semiconductor device 200 includes the $n^-$-type drift region 1, the p-type base region 2, the $n^+$-type source region 3, the $p^+$-type contact region 4, the $n^+$-type drain region 5, the gate electrode 10, the drain electrode 11, the source electrode 12, the FP electrode 13, the gate pad 14, the first insulating part 21, and the second insulating part 22. A description is omitted for configurations similar to those of the semiconductor device 100 according to the first embodiment.

In the semiconductor device 200 as illustrated in FIGS. 4 and 5, pluralities of the gate electrode 10, the FP electrode 13, and the first insulating part 21 are arranged in the second direction D2; and the gate electrode 10, the FP electrode 13, and the first insulating part 21 each extend in the third direction D3. The p-type base region 2, the $n^+$-type source region 3, and the $p^+$-type contact region 4 extend in the third direction D3 and are located between the first insulating parts 21 adjacent to each other in the second direction D2. The second insulating part 22 is located on each $n^+$-type source region 3 along each $n^+$-type source region 3. The source electrode 12 is not illustrated in FIG. 5.

As illustrated in FIG. 6, the semiconductor device 200 does not include the gate wiring layer 15, the connection part 15a, the FP wiring layer 16, the connection part 16a, the connection part 16b, the insulating layer 31, and the insulating layer 32. The connection part 12a extends upward from the $p^+$-type contact region 4, extends through the second insulating part 22, and is electrically connected with the source electrode 12.

For example, the gate electrode 10 is electrically connected with the gate pad 14 at a third direction D3 end portion via a not-illustrated connection part. For example, the FP electrode 13 is electrically connected with the source electrode 12 at a third direction D3 end portion via a not-illustrated connection part.

In the semiconductor device 200 according to the second embodiment as well, the second insulating part 22 has tensile stress in the first direction D1. For example, the thickness T1 and the tensile stress in the first direction D1 of the second insulating part 22 may be in the same range described in the semiconductor device 100 according to the first embodiment.

In the semiconductor device 200 according to the second embodiment as well, tensile stress is applied along the first direction D1 to the p-type base region 2 (the channel) by the second insulating part 22. Thereby, tensile strain is generated in the channel; and the on-resistance is reduced.

Effects of the semiconductor device according to the embodiment will now be described with reference to FIGS. 7A, 7B, 8A, and 8B.

Figures 7A, 7B:
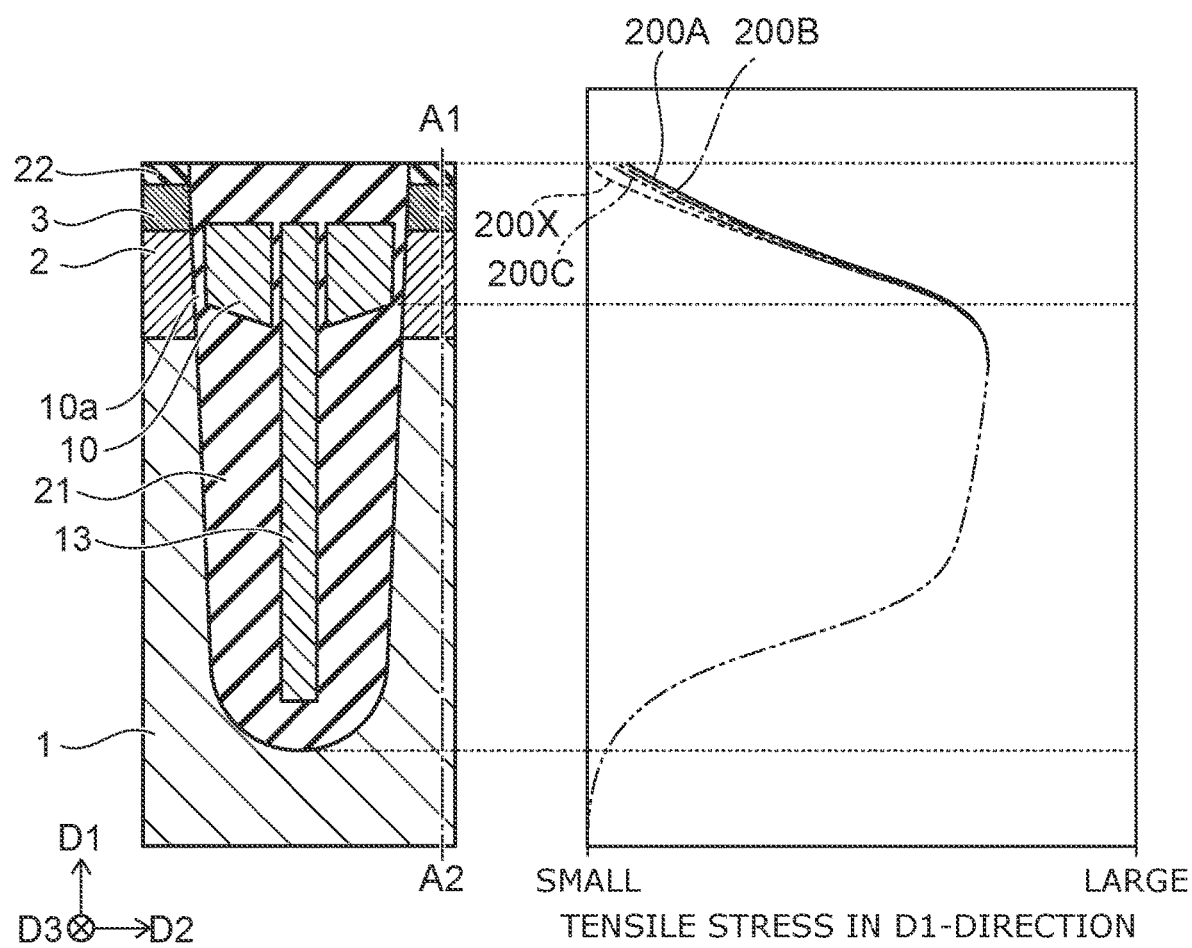
FIG. 7A is a cross-sectional view illustrating a portion of the semiconductor device according to the embodiment.
FIG. 7B is a graph illustrating characteristics of semiconductor devices according to the embodiment and a reference example.

FIG. 7A is a cross-sectional view illustrating a portion of the semiconductor device according to the embodiment.

FIG. 7B is a graph illustrating characteristics of semiconductor devices according to the embodiment and a reference example.

FIG. 7B illustrates simulation results of the tensile stress along line A1-A2 of FIG. 7A. The horizontal axis of FIG. 7B is the magnitude of the tensile stress; and the vertical axis is the position in the first direction D1. Here, although a semiconductor device that has a stripe structure is described as an example, similar effects also are obtained for a semiconductor device that has a dot structure.

In FIG. 7B, the stress of a semiconductor device 200A according to the embodiment that includes the second insulating part 22 having a tensile stress of 500 MPa and a thickness of 300 nm is illustrated by a solid line. In FIG. 7B, the stress of a semiconductor device 200B according to the embodiment that includes the second insulating part 22 having a tensile stress of 300 MPa and a thickness of 300 nm is illustrated by a single dot-dash line. In FIG. 7B, the stress of a semiconductor device 200C according to the embodiment that includes the second insulating part 22 having a tensile stress of 100 MPa and a thickness of 300 nm is illustrated by a double dot-dash line. In FIG. 7B, the stress of a semiconductor device 200X according to the reference example that does not include the second insulating part 22 is illustrated by a broken line.

As illustrated in FIG. 7B, a large tensile stress is generated at a position at which the second insulating part 22 is arranged with the first insulating part 21 in the second direction D2. When stress is applied from the first insulating part 21 to the n$^-$-type drift region 1, tensile strain is generated along the first direction D1 in the n$^-$-type drift region 1. When the semiconductor device is in the on-state, carriers flow along the first direction D1. In other words, the tensile strain is generated along the direction in which the carriers flow. When the tensile strain is generated along the direction in which the carriers flow, the mobility of the carriers is improved. In other words, the on-resistance of the semiconductor device can be reduced by the tensile strain.

The inventor discovered from the results illustrated in FIG. 7B that a large tensile stress is generated in the n$^-$-type drift region 1 that is arranged with the first insulating part 21, but the stress is greatly reduced in the p-type base region 2 that is arranged with the gate electrode 10. To further reduce the on-resistance of the semiconductor device, it is favorable to increase the tensile stress in the p-type base region 2.

Based on this knowledge, the second insulating part 22 is located on the n$^+$-type source region 3 in the semiconductor devices 200A to 200C according to the embodiment. By providing the second insulating part 22, a larger tensile stress can be applied to the p-type base region 2 positioned under the n$^+$-type source region 3 as illustrated in FIG. 7B. Thereby, a larger tensile strain is generated in the p-type base region 2 along the first direction D1. As a result, compared to the semiconductor device 200X according to the reference example, the on-resistances of the semiconductor devices 200A to 200C according to the embodiment can be reduced.

More specifically, compared to the semiconductor device 200X according to the reference example, it is considered that the on-resistances of the semiconductor devices 200A to 200C according to the embodiment can be reduced by about 1.5%. Also, FIG. 7B suggests that a larger tensile stress can be applied to the p-type base region 2 as the tensile stress of the second insulating part 22 increases.

Figures 8A, 8B:
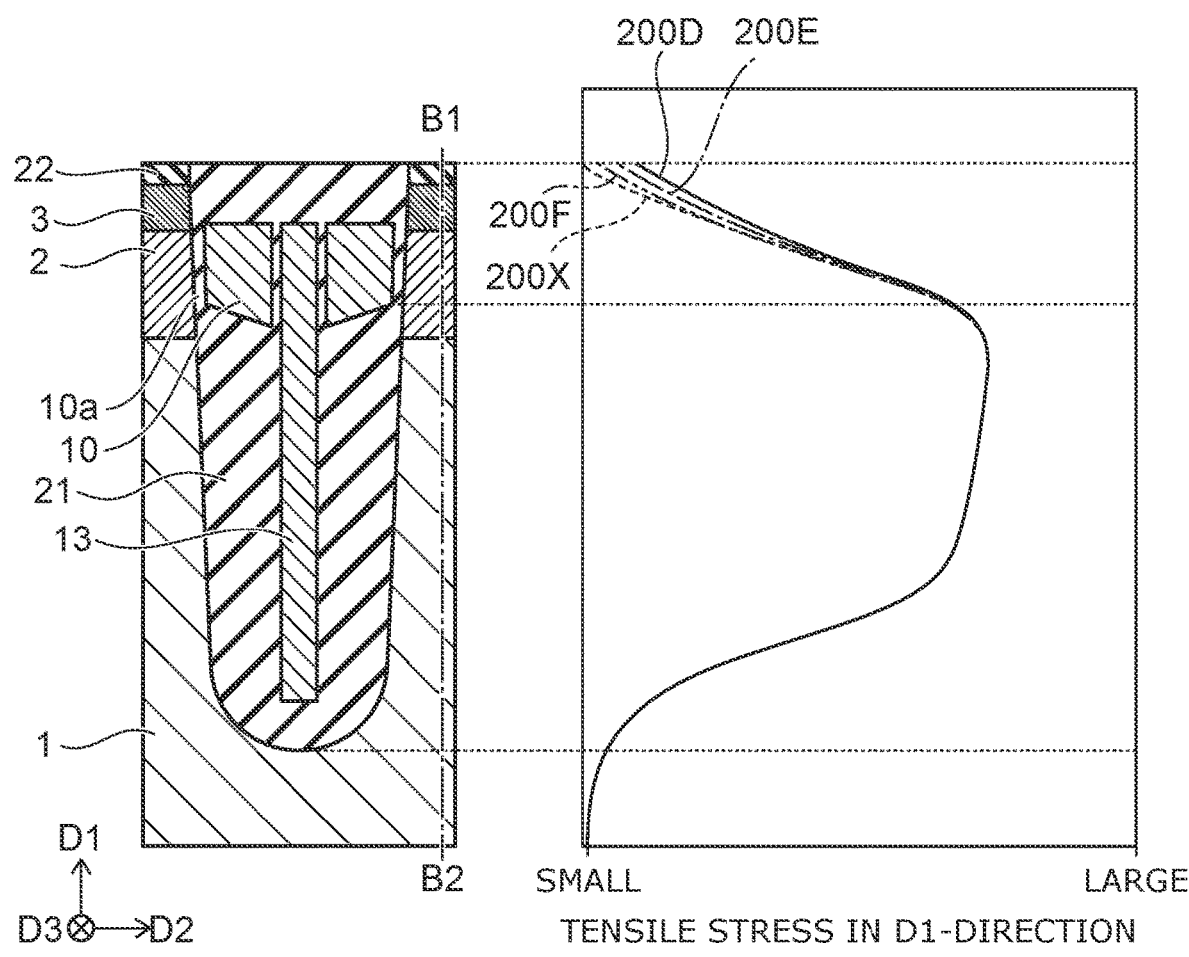
FIG. 8A is a cross-sectional view illustrating a portion of the semiconductor device according to the embodiment.
FIG. 8B is a graph illustrating characteristics of semiconductor devices according to the embodiment and the reference example.

FIG. 8A is a cross-sectional view illustrating a portion of the semiconductor device according to the embodiment.

FIG. 8B is a graph illustrating characteristics of semiconductor devices according to the embodiment and the reference example.

FIG. 8B illustrates simulation results of the tensile stress along line B1-B2 of FIG. 8A. The horizontal axis of FIG. 8B is the magnitude of the tensile stress; and the vertical axis is the position in the first direction D1. Here, although a semiconductor device that has a stripe structure is described as an example, similar effects also are obtained for a semiconductor device that has a dot structure.

In FIG. 8B, the stress of a semiconductor device 200D according to the embodiment that includes the second insulating part 22 having a tensile stress of 300 MPa and a thickness of 500 nm is illustrated by a solid line. In FIG. 8B, the stress of a semiconductor device 200E according to the embodiment that includes the second insulating part 22 having a tensile stress of 300 MPa and a thickness of 300 nm is illustrated by a single dot-dash line. In FIG. 8B, the stress of a semiconductor device 200F according to the embodiment that includes the second insulating part 22 having a tensile stress of 300 MPa and a thickness of 100 nm is illustrated by a double dot-dash line. In FIG. 8B, the stress of the semiconductor device 200X according to the reference example that does not include the second insulating part 22 is illustrated by a broken line.

As illustrated in FIG. 8B, in the semiconductor devices 200D to 200F according to the embodiment as well, by providing the second insulating part 22 that has tensile stress on the n$^+$-type source region 3, a larger tensile stress can be applied to the p-type base region 2 positioned under the n$^+$-type source region 3. Compared to the semiconductor device 200X according to the reference example, the on-resistances of the semiconductor devices 200D to 200F according to the embodiment can be reduced thereby.

More specifically, compared to the semiconductor device 200X according to the reference example, it is considered that the on-resistances of the semiconductor devices 200D to 200F according to the embodiment can be reduced by about 0.5% to 2.0%. Also, FIG. 8B suggests that a larger tensile stress can be applied to the p-type base region 2 as the thickness of the second insulating part 22 increases.

Thus, the on-resistance can be reduced by providing the second insulating part 22 that has tensile stress in the first direction D1. Also, the effects on the characteristics of the gate electrode 10 due to the tensile stress of the second insulating part 22 can be suppressed because the second insulating part 22 does not overlap the gate electrode 10 in the first direction D1.

The desired tensile stress can be more easily provided to the second insulating part 22 by the second insulating part 22 including at least one of silicon nitride or alumina.

The on-resistance can be more effectively reduced when the tensile stress in the first direction D1 of the second insulating part 22 is not less than 100 MPa and not more than 500 MPa.

Also, the on-resistance can be more effectively reduced when the thickness T1 of the first direction D1 of the second insulating part 22 is not less than 100 nm and not more than 500 nm. Also, such a thickness does not easily affect the other processes when manufacturing.

The on-resistance can be further reduced by further including the FP electrode 13. The effects on the characteristics of the FP electrode 13 due to the tensile stress of the second insulating part 22 can be suppressed because the second insulating part 22 does not overlap the FP electrode 13 in the first direction D1.

According to embodiments as described above, the semiconductor device is provided in which the on-resistance can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Embodiments described above can be implemented in combination with each other.

What is claimed is:

1. A semiconductor device, comprising:
   a first electrode;
   a first semiconductor region located on the first electrode, the first semiconductor region being of a first conductivity type;
   a second semiconductor region located on the first semiconductor region, the second semiconductor region being of a second conductivity type;
   a third semiconductor region located selectively on the second semiconductor region, the third semiconductor region being of the first conductivity type;
   a first insulating part arranged with the third semiconductor region, the second semiconductor region, and a portion of the first semiconductor region in a second direction perpendicular to a first direction, the first direction being from the first electrode toward the first semiconductor region;
   a gate electrode located in the first insulating part, the gate electrode facing the second semiconductor region in the second direction;
   a second insulating part located on the third semiconductor region, the second insulating part not overlapping the gate electrode in the first direction, the second insulating part having tensile stress in the first direction; and
   a second electrode located on the second insulating part and electrically connected with the third semiconductor region.

2. The device according to claim 1, wherein the second insulating part includes at least one of silicon nitride or alumina.

3. The device according to claim 1, wherein the tensile stress in the first direction of the second insulating part is not less than 100 MPa and not more than 500 MPa.

4. The device according to claim 1, wherein a thickness in the first direction of the second insulating part is not less than 100 nm and not more than 500 nm.

5. The device according to claim 1, further comprising:
   a third electrode located in the first insulating part,
   the third electrode facing the gate electrode in the second direction and being electrically isolated from the gate electrode,
   the gate electrode being positioned between the third electrode and the second semiconductor region in the second direction,
   the second insulating part not overlapping the third electrode in the first direction.

* * * * *